United States Patent [19]

Liu

[11] Patent Number: 5,622,884
[45] Date of Patent: Apr. 22, 1997

[54] METHOD FOR MANUFACTURING A SEMICONDUCTOR MEMORY CELL AND A POLYSILICON LOAD RESISTOR OF THE SEMICONDUCTOR MEMORY CELL

[75] Inventor: Min-Sea Liu, Hsinchu, Taiwan

[73] Assignee: Winbond Electronics Corp., Hsinchu, Taiwan

[21] Appl. No.: 655,139

[22] Filed: May 30, 1996

[51] Int. Cl.$^6$ .......................... H01L 21/70; H01L 27/00; H01L 21/8244

[52] U.S. Cl. .......................... 438/238; 257/904; 438/385; 438/659

[58] Field of Search .............................. 437/52, 60, 918; 257/903, 904

[56] References Cited

U.S. PATENT DOCUMENTS

| | | | |
|---|---|---|---|
| 5,108,945 | 4/1992 | Matthews | 437/60 |
| 5,159,430 | 10/1992 | Manning et al. | |
| 5,179,033 | 1/1993 | Adan | 437/41 |
| 5,232,865 | 8/1993 | Manning et al. | |
| 5,418,393 | 5/1995 | Hayden | 257/347 |
| 5,514,617 | 5/1996 | Liu | 437/60 |

Primary Examiner—John Niebling
Assistant Examiner—Michael S. Lebentritt

[57] ABSTRACT

A method is provided for manufacturing a polysilicon load resistor of a semiconductor memory cell. The semiconductor memory cell is formed with at least one transistor and has a semiconductor substrate with a gate dielectric layer on a portion thereof, and a gate electrode layer over the gate dielectric layer. The method includes the steps of: (a) depositing a insulating layer over the gate electrode layer and the remaining portion of the semiconductor substrate around the gate electrode and gate dielectric layers; (b) depositing a polysilicon layer over the insulating layer; (c) implanting ions in the polysilicon layer so as to adjust resistance thereof; (d) etching the polysilicon layer so as to form a high resistance load resistor; (e) etching the insulating layer so as to expose a portion of the gate electrode layer; and (f) forming a metal contact at two ends of the load resistor, one of the metal contacts being located on the exposed portion of the gate electrode so as to establish electrical connection between the gate electrode layer and the load resistor.

4 Claims, 15 Drawing Sheets

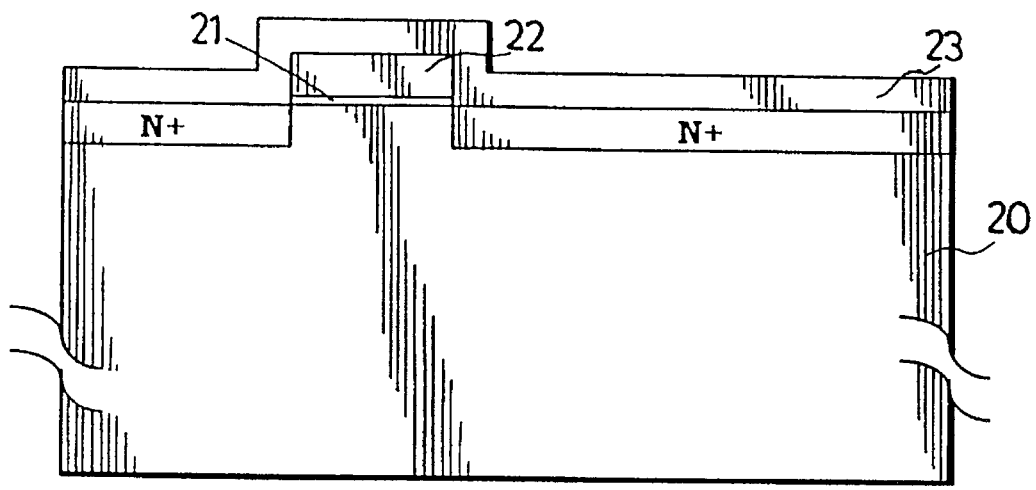
F I G. 4
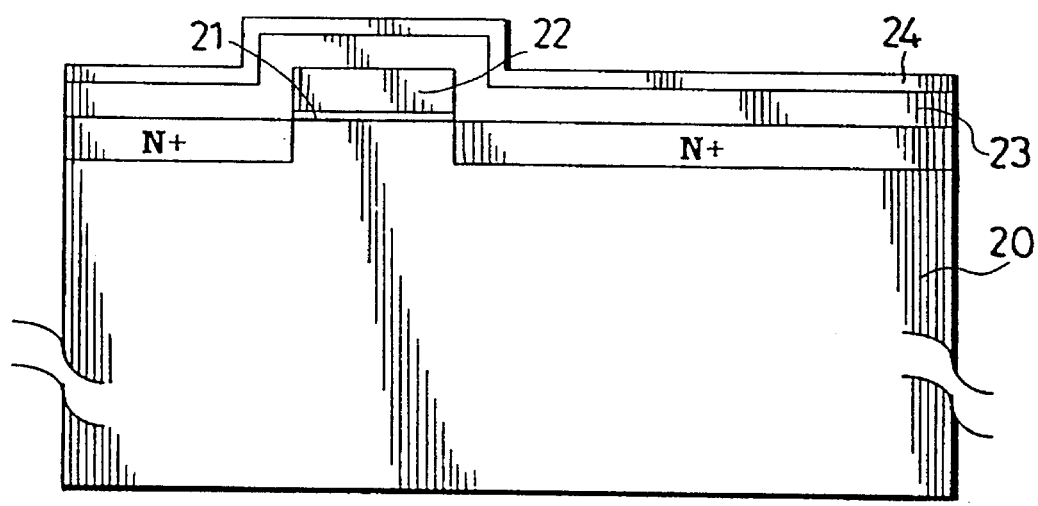
F I G. 5

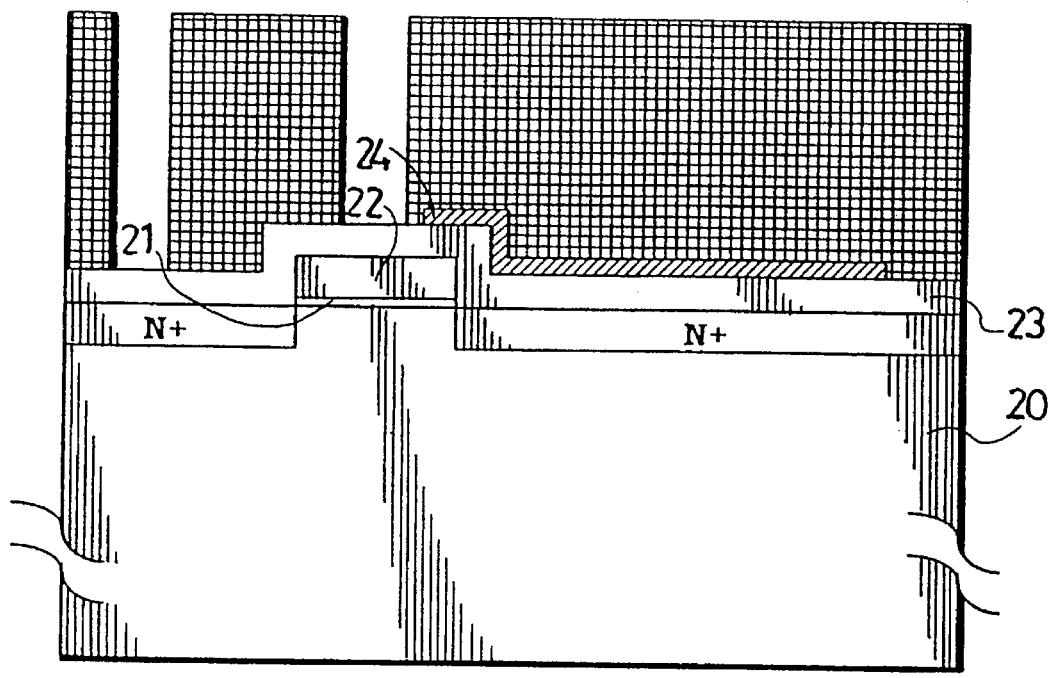
F I G. 10
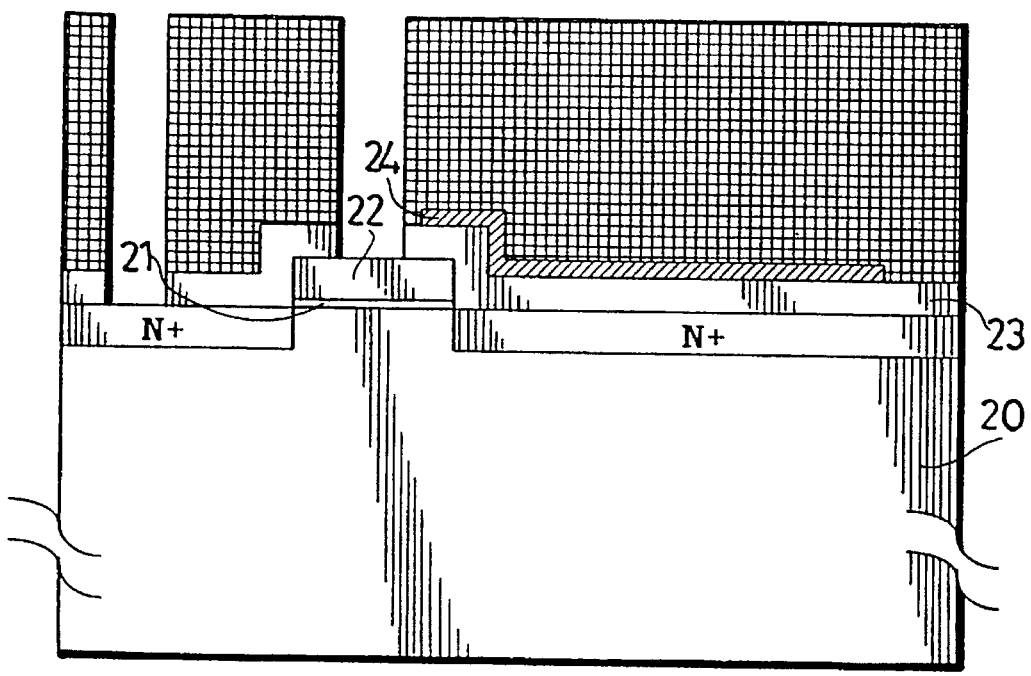
F I G. 11

METHOD FOR MANUFACTURING A SEMICONDUCTOR MEMORY CELL AND A POLYSILICON LOAD RESISTOR OF THE SEMICONDUCTOR MEMORY CELL

BACKGROUND OF THE INVENTION

1. Field of the Invention

This invention relates to a semiconductor memory cell with a polysilicon load resistor, more particularly to a method for manufacturing a semiconductor memory cell and a polysilicon load resistor of the semiconductor memory cell.

2. Description of the Related Art

FIG. 1 is a schematic circuit diagram of a semiconductor memory cell which is usually referred to as a static random access memory cell (SRAM). The semiconductor memory cell includes two load resistors (R1 and R2), two pull down transistors (Q1 and Q2) and two pass transistors (Q3 and Q4). The branch from a power source (Vcc) to a node (A) and the branch from the power source (Vcc) to a node (B) are formed from a polysilicon layer. Each of the branches contains a respective one of the load resistors (R1 and R2) which has high resistance, and low resistance sections which connect the respective one of the load resistors (R1 and R2) to the power source (Vcc) and to a respective one of the nodes (A and B).

FIGS. 2A to 2K show the steps of a conventional method for manufacturing a polysilicon load resistor of the aforementioned semiconductor memory cell. To facilitate explanation of the conventional manufacturing method, only a portion of the semiconductor memory cell of FIG. 1 is shown in FIGS. 2A to 2K. As illustrated in FIG. 2A, a semiconductor substrate 10 on which a transistor is formed is provided. The transistor has a gate dielectric layer 11 on a portion of the semiconductor substrate 10, and a gate electrode layer 12 on the gate dielectric layer 11. An insulating layer 13, which is an inter polysilicon dielectric layer, is deposited over the gate electrode layer 12 and the remaining portion of the semiconductor substrate 10 around the gate dielectric and gate electrode layers 11,12. Then, as illustrated in FIGS. 2B and 2C, the insulating layer 13 is masked and anisotropically etched down to the gate electrode layer 12 and to the semiconductor substrate 10 so as to expose a portion of the gate electrode layer 12 and a portion of the semiconductor substrate 10. As illustrated in FIG. 2D, a polysilicon layer 14 is deposited over the exposed portion of the gate electrode layer 12, the exposed portion of the semiconductor substrate 10 and the remaining portion of the insulating layer 13. Then, as illustrated in FIG. 2E, low dosage ions are implanted in the polysilicon layer 14 so as to adjust resistance thereof. As illustrated in FIGS. 2F, 2G and 2H, the polysilicon layer 14 is masked and anisotropically etched down to the insulating layer 13 so as to remove a portion of the insulating layer 13.

As illustrated in FIG. 2I, a mask (M) is provided on a portion of the polysilicon layer 14, which portion of the polysilicon layer 14 serves as a load resistor of the semiconductor memory cell of FIG. 1. Then, as illustrated in FIGS. 2J and 2K, high dosage ions are implanted in portions of the polysilicon layer 14 which are not covered by the mask (M) so as to lower the resistance of the same, thereby forming the low resistance sections of the semiconductor memory cell of FIG. 1. Thus, the dopant concentration in the low resistance sections is greater than that in the load resistor.

As illustrated in FIG. 2L, the main drawback of the conventional manufacturing method resides in that the length of the load resistor is usually reduced, thereby reducing the resistance of the same, since the dopants in the low resistance sections at two ends of the load resistor diffuse into the load resistor during subsequent thermal process, thereby increasing the power consumption of the semiconductor memory cell.

Therefore, in order to ensure that the load resistor has sufficient length and resistance after the subsequent thermal process, the load resistor must be lengthened. However, lengthening of the load resistor increases the size of the semiconductor memory cell.

SUMMARY OF THE INVENTION

Therefore, the objective of the present invention is to provide a method for manufacturing a semiconductor memory cell and a polysilicon load resistor of the semiconductor memory cell, which method can overcome the drawbacks that are commonly associated with the aforementioned prior art.

According to one aspect of the present invention, a method is provided for manufacturing a polysilicon load resistor of a semiconductor memory cell. The semiconductor memory cell is formed with at least one transistor and has a semiconductor substrate with a gate dielectric layer on a portion thereof, and a gate electrode layer over the gate dielectric layer. The method includes the steps of: (a) depositing an insulating layer over the gate electrode layer and remaining portion of the semiconductor substrate around the gate dielectric and gate electrode layers; (b) depositing a polysilicon layer over the insulating layer; (c) implanting ions in the polysilicon layer so as to adjust resistance thereof; (d) etching the polysilicon layer so as to form a high resistance load resistor; (e) etching the insulating layer so as to expose a portion of the gate electrode layer; and (f) forming a metal contact at two ends of the load resistor, one of the metal contacts being located on the exposed portion of the gate electrode so as to establish electrical connection between the gate electrode layer and the load resistor.

According to another aspect of the present invention, a method is provided for manufacturing a semiconductor memory cell with a polysilicon load resistor and a transistor having a gate electrode connected electrically to the load resistor. The method includes the steps of: (a) forming a transistor on a semiconductor substrate, the transistor having a gate dielectric layer on a portion of the substrate and a gate electrode layer on the gate dielectric layer; (b) depositing an insulating layer over the gate electrode layer and remaining portion of the semiconductor substrate around the gate dielectric and gate electrode layers; (c) depositing a polysilicon layer over the insulating layer; (d) implanting ions in the polysilicon layer so as to adjust resistance thereof; (e) etching the polysilicon layer so as to form a high resistance load resistor; (f) etching the insulating layer so as to expose a portion of the gate electrode layer; and (g) forming a metal contact at two ends of the load resistor, one of the metal contacts being located on the exposed portion of the gate electrode layer so as to establish electrical connection between the gate electrode layer and the load resistor.

BRIEF DESCRIPTION OF THE DRAWINGS

Other features and advantages of the present invention will become apparent in the following detailed description of the preferred embodiment, with reference to the accompanying drawings, of which:

FIGS. 4 to 15 illustrate the steps of the preferred embodiment of the method of the present invention.

DETAILED DESCRIPTION OF THE PREFERRED EMBODIMENT

Figure 1:
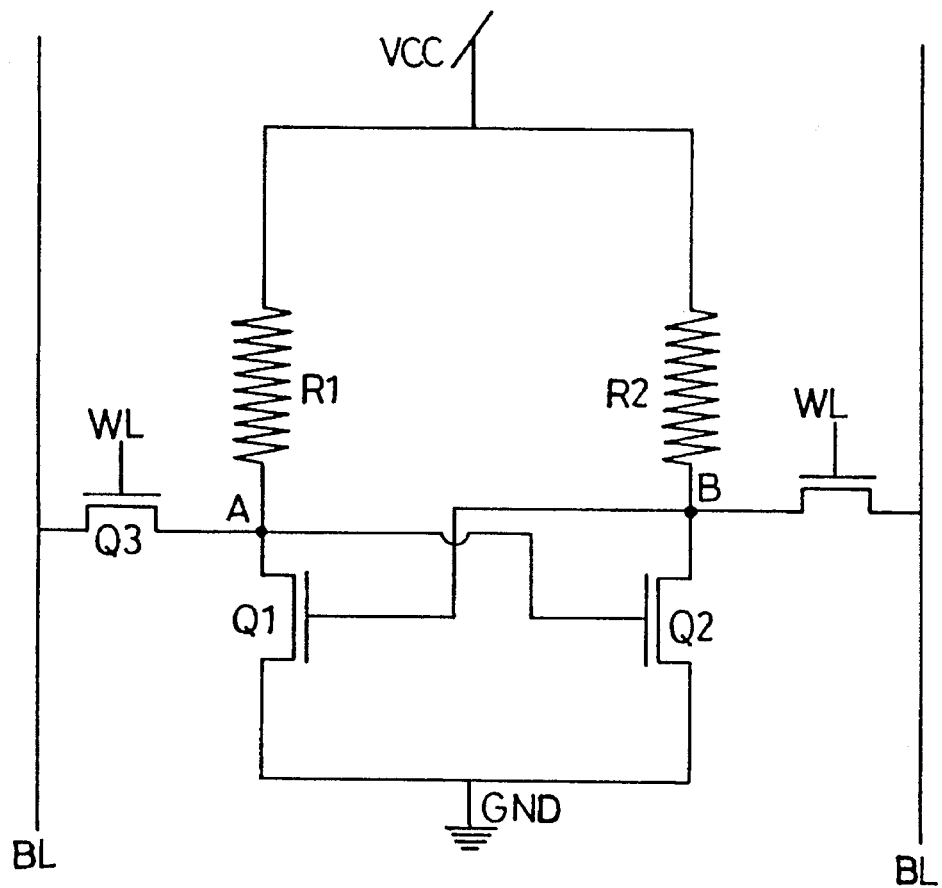
FIG. 1 is a schematic circuit diagram illustrating a conventional semiconductor memory cell with a load resistor.
Figure 2A:
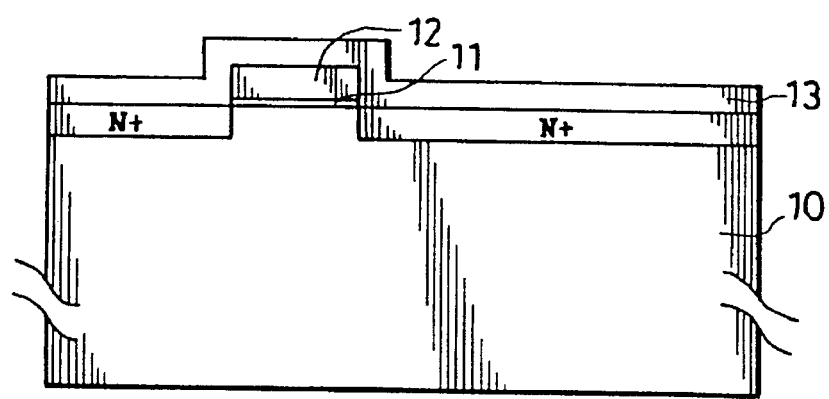
FIGS. 2A to 2K illustrate the steps of a conventional method for manufacturing a polysilicon load resistor of the conventional semiconductor memory cell of FIG. 1.
Figure 2B:
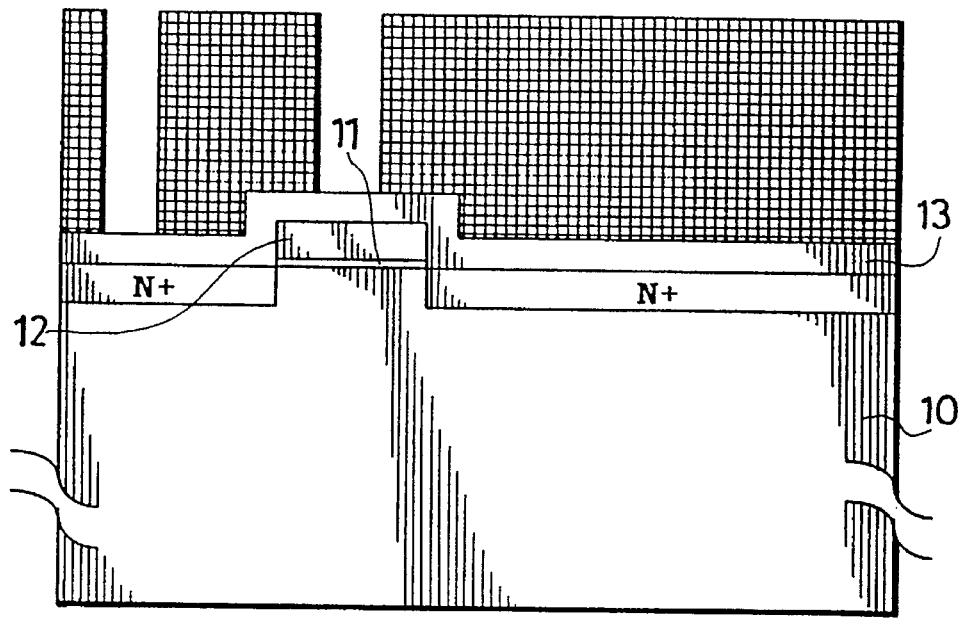
Figure 2C:
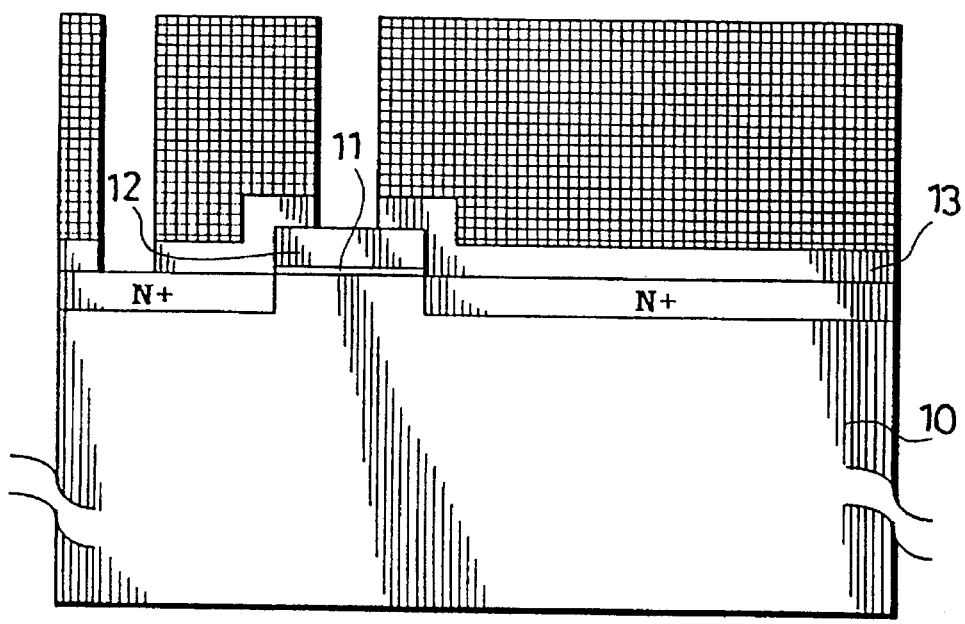
Figure 2D:
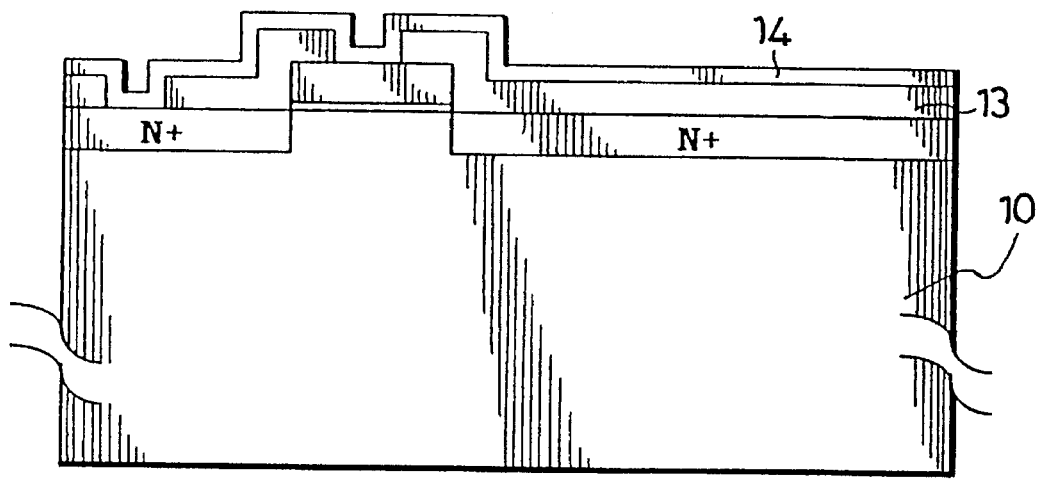
Figure 2E:
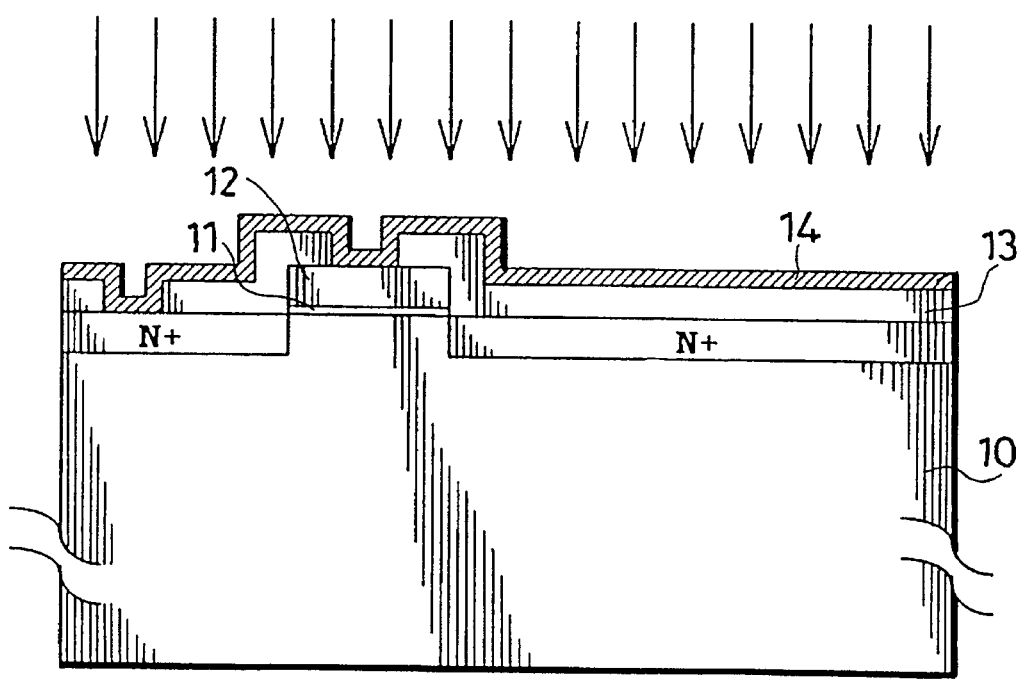
Figure 2F:
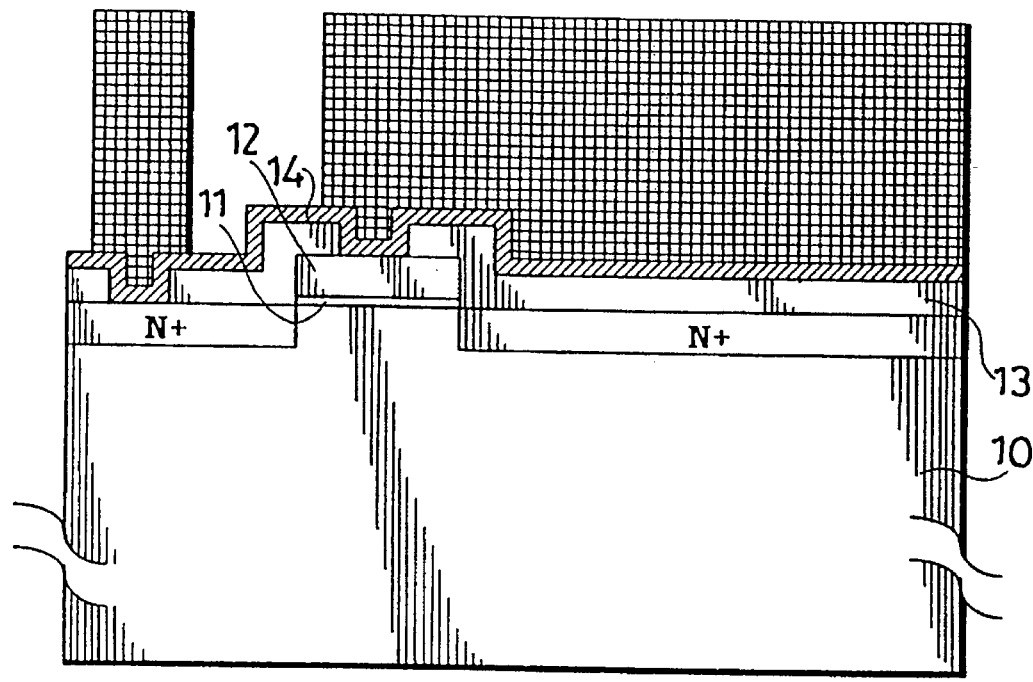
Figure 2G:
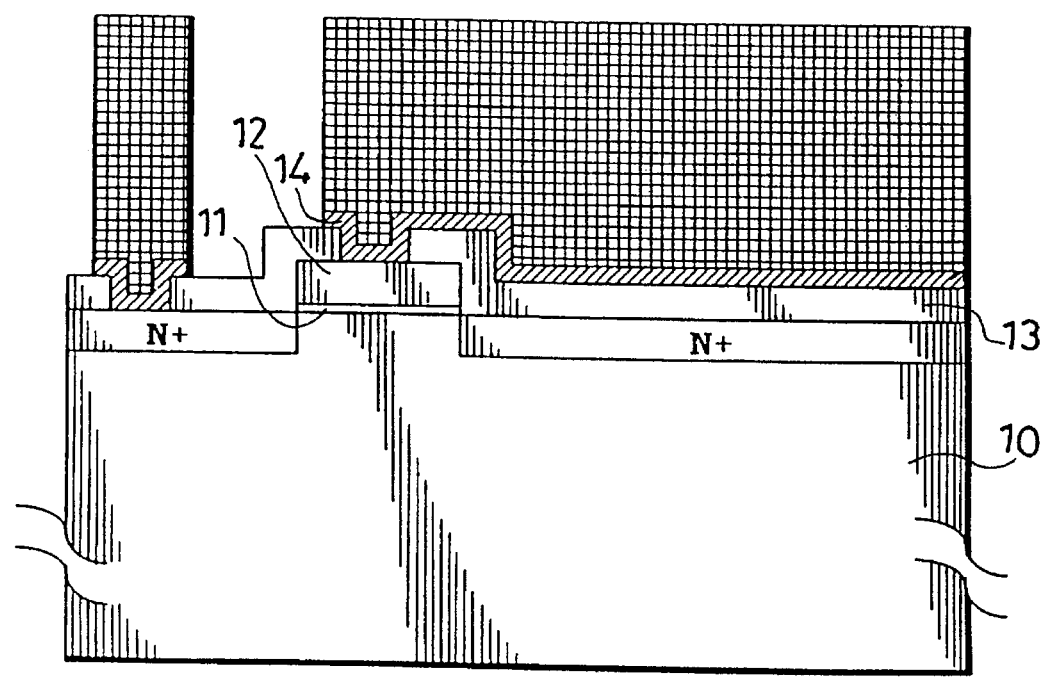
Figure 2H:
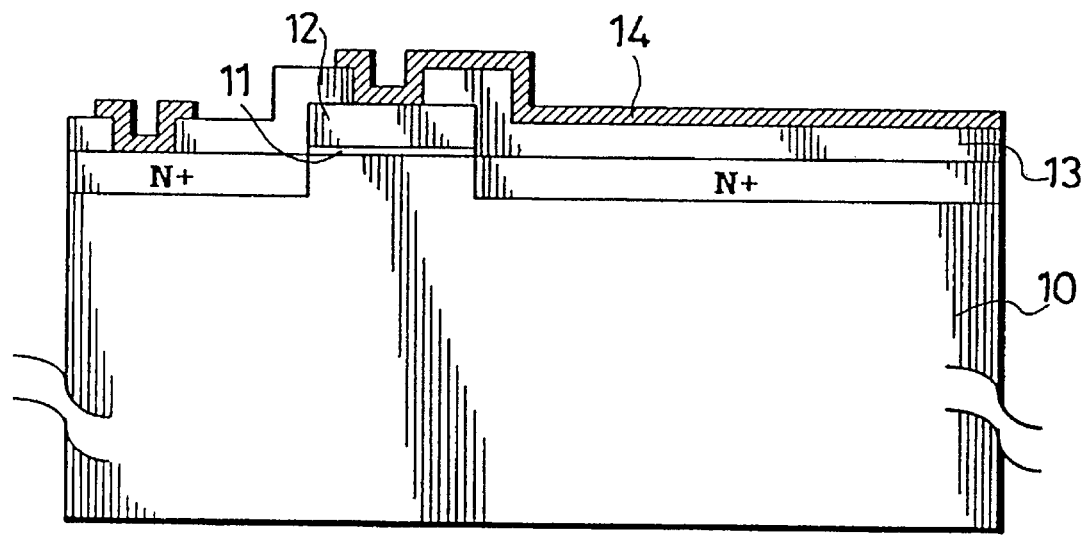
Figure 2I:
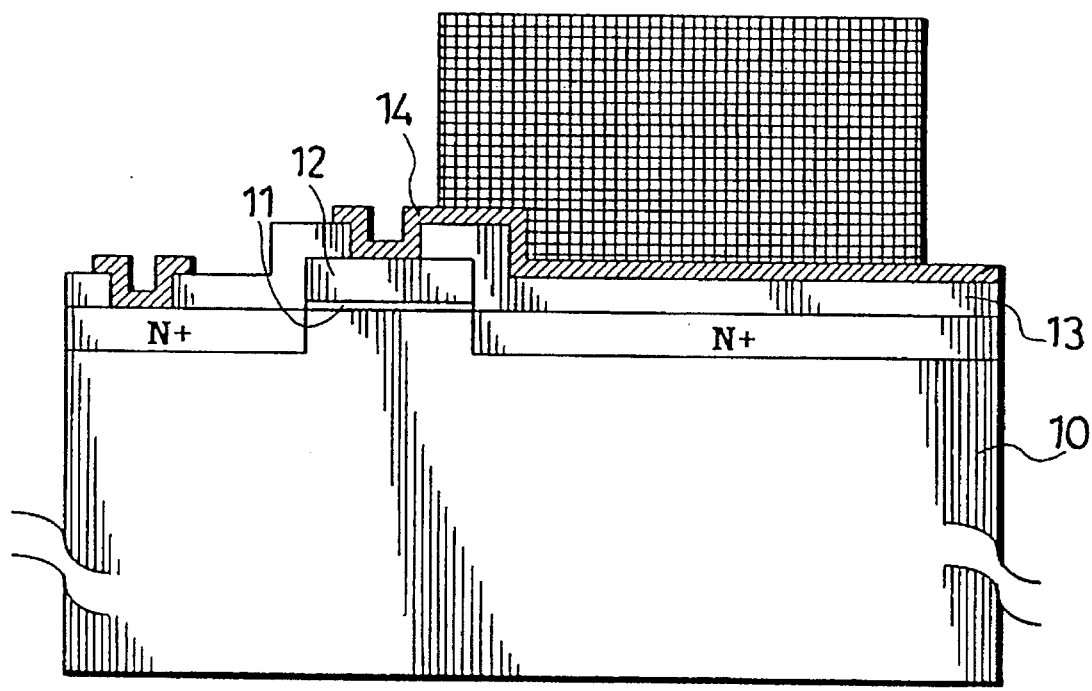
Figure 2J:
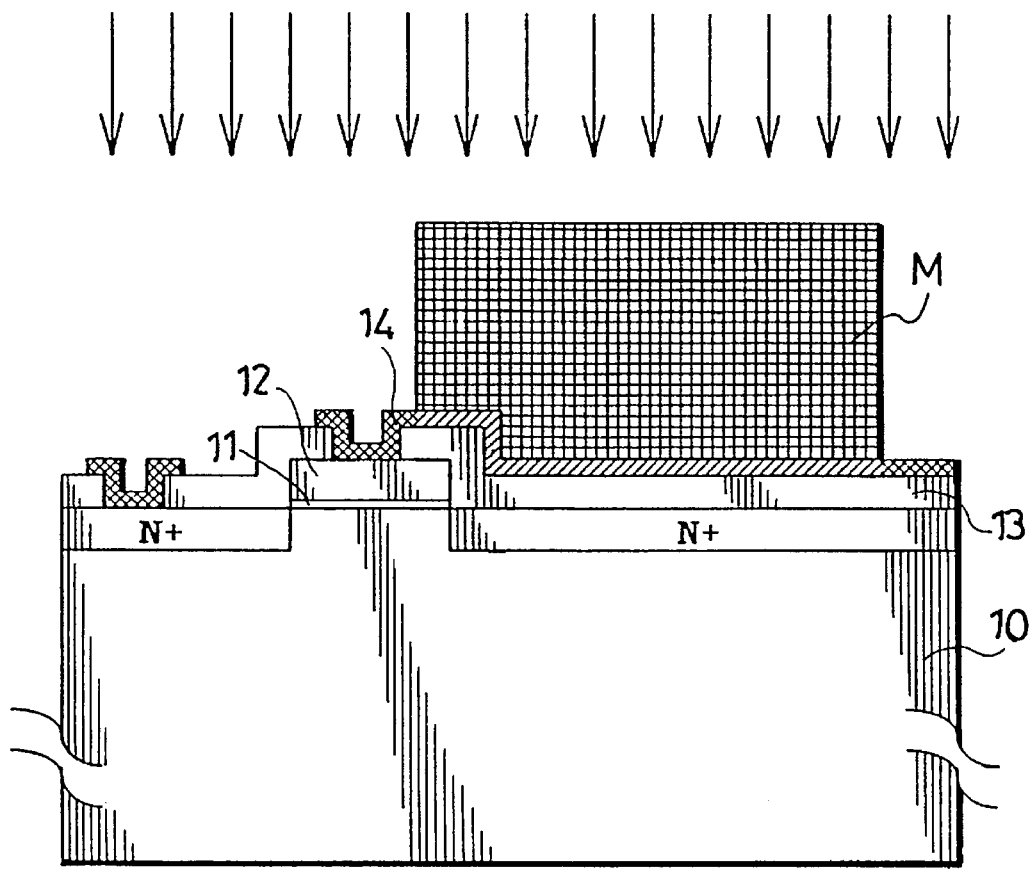
Figure 2K:
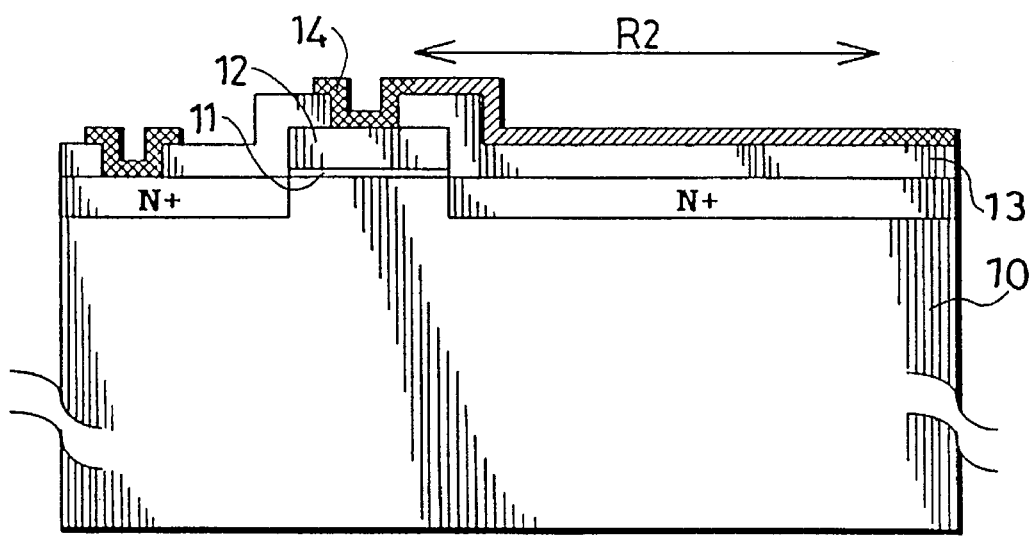
Figure 2L:
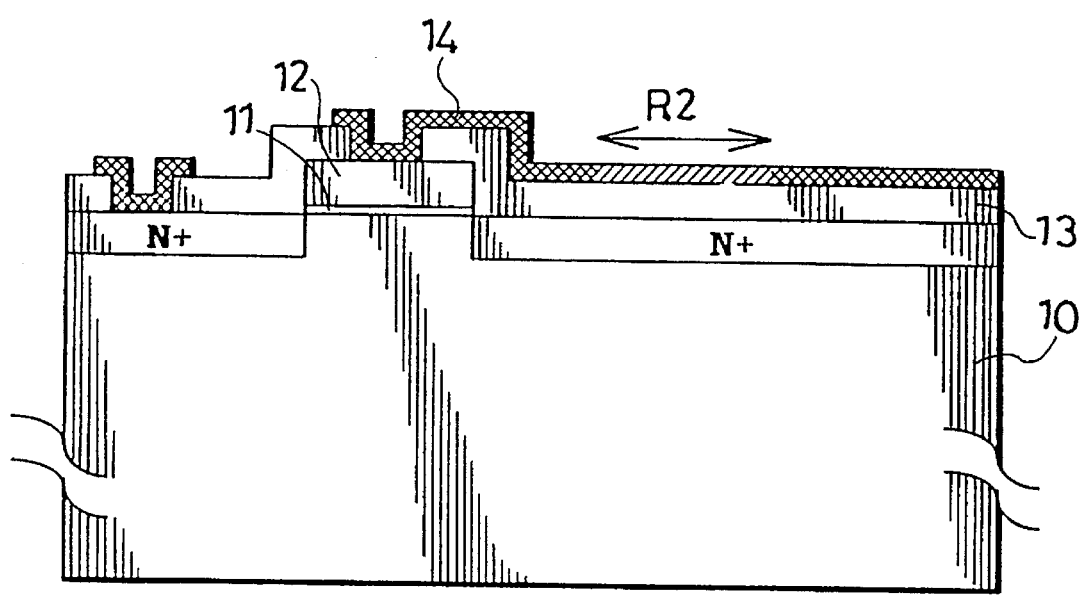
FIG. 2L is a sectional view showing a portion of the semiconductor memory cell of FIG. 1, the length of a load resistor of the semiconductor memory cell being reduced after a subsequent thermal process.

Before the present invention is described in greater detail, it should be noted that like elements are indicated by the same reference numerals throughout the disclosure.

Figure 3:
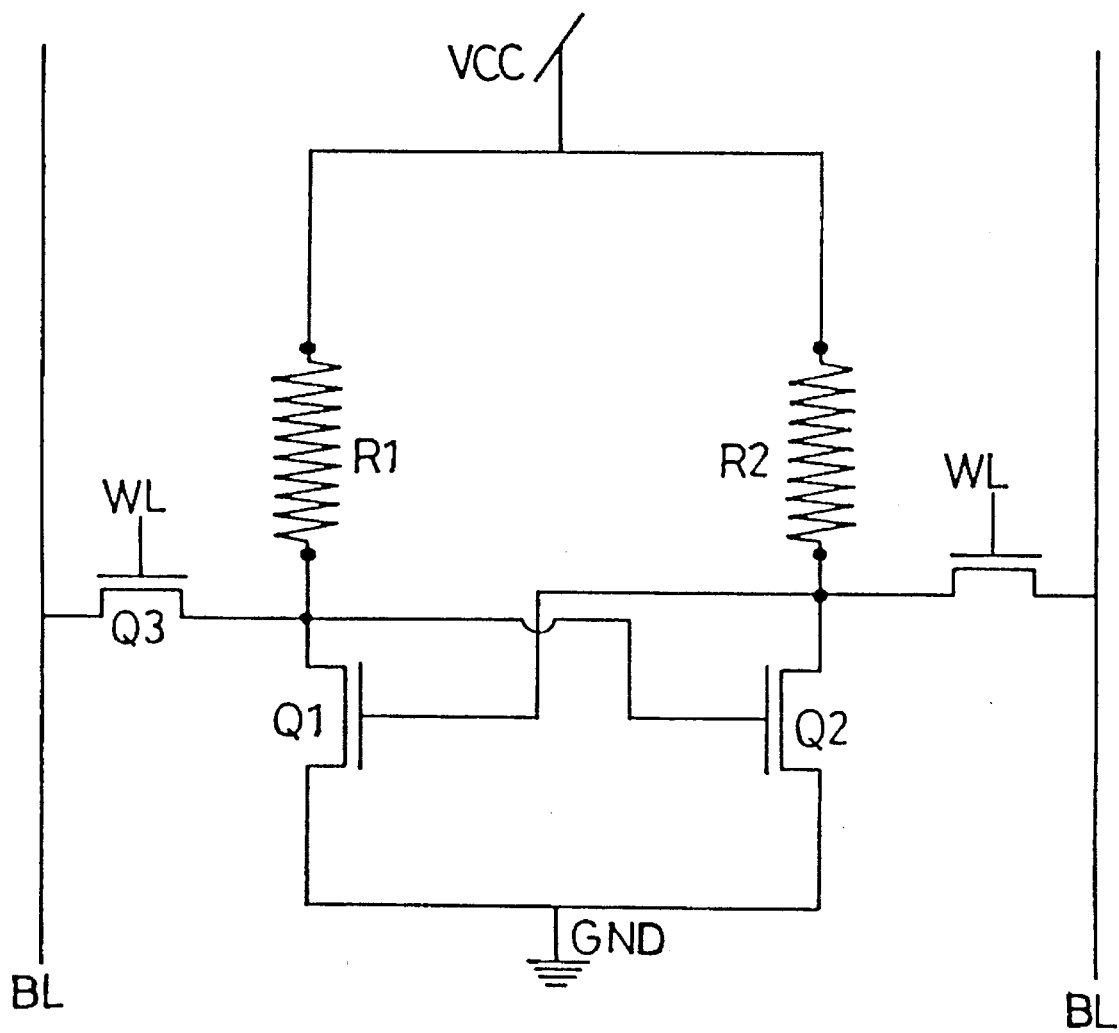
FIG. 3 is a schematic circuit diagram illustrating a semiconductor memory cell with a load resistor that is fabricated according to the preferred embodiment of a method for manufacturing a load resistor of a semiconductor memory cell of the present invention.

As illustrated in FIG. 3, a semiconductor memory cell which is fabricated according to the manufacturing method of the preferred embodiment is shown to include two load resistors (R1 and R2), two pull down transistors (Q1 and Q2) and two pass transistors (Q3 and Q4). Each of a branch from a power source (Vcc) to a node (C) and a branch from the power source (Vcc) to a node (D) contains a load resistor (R1,R2) which has high resistance and interconnectors which connect the respective load resistor (R1,R2) to the power source (Vcc) and to the respective node (C,D).

FIGS. 4 to 15 illustrate the preferred embodiment of a method for manufacturing a polysilicon load resistor of a semiconductor memory cell in accordance with the present invention. In this embodiment, the semiconductor memory cell is an SRAM.

With reference to FIG. 4, a semiconductor substrate 20 on which at least one transistor is formed is provided. The semiconductor substrate 20 has a gate dielectric layer 21 on a portion thereof, and a gate electrode layer 22 over the gate dielectric layer 21. The gate dielectric layer 21 is formed using thermal oxidation and ranges from 70 Å to 300 Å in thickness. The gate electrode layer 22 is composed of heavily doped polysilicon that is deposited by chemical vapor deposition (CVD) and has a thickness ranging from 1500 Å to 4500 Å. An insulating layer 23 is deposited over the gate electrode layer 22 and the remaining portion of the semiconductor substrate 20 around the gate dielectric and gate electrode layers 21,22, and is composed of silicon oxide that is deposited by chemical vapor deposition. The insulating layer 23 is an inter polysilicon dielectric layer and has a thickness ranging from 500 Å to 3500 Å.

As illustrated in FIG. 5, a polysilicon layer 24 is deposited over the insulating layer 23 by chemical vapor deposition and has a thickness ranging from 300 Å to 3000 Å.

Figure 6:
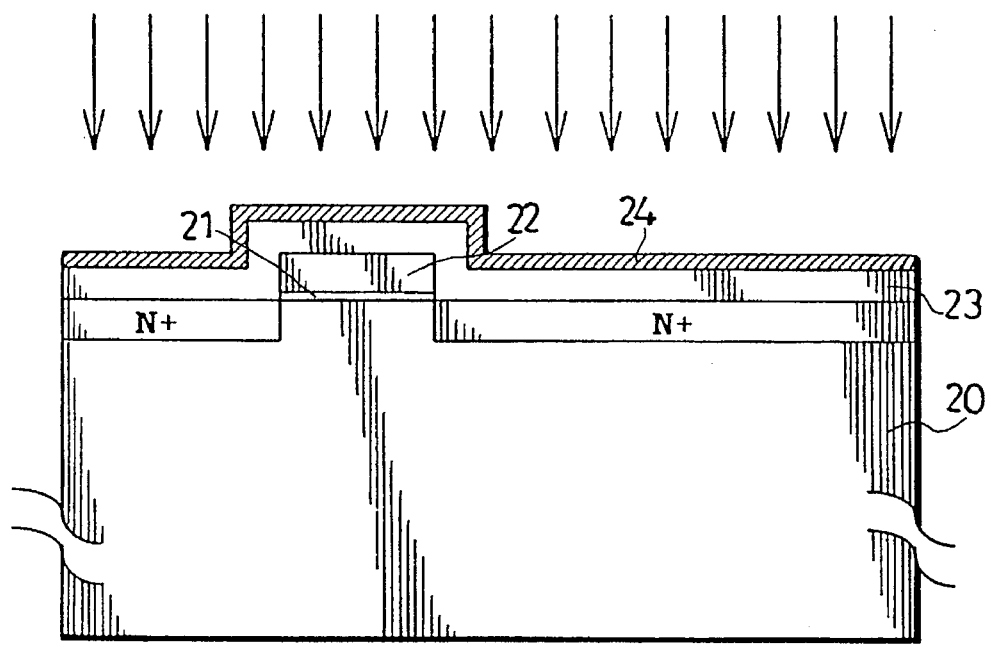

With reference to FIG. 6, ions are implanted in the polysilicon layer 24 so as to adjust the resistance thereof. In the present embodiment, arsenic ions, phosphorus ions, BF2 ions or boron ions may be used, with an energy of about 5 to 150 keV and a dosage of about 1E13 to 3E14 ions/cm$^2$.

Figure 7:
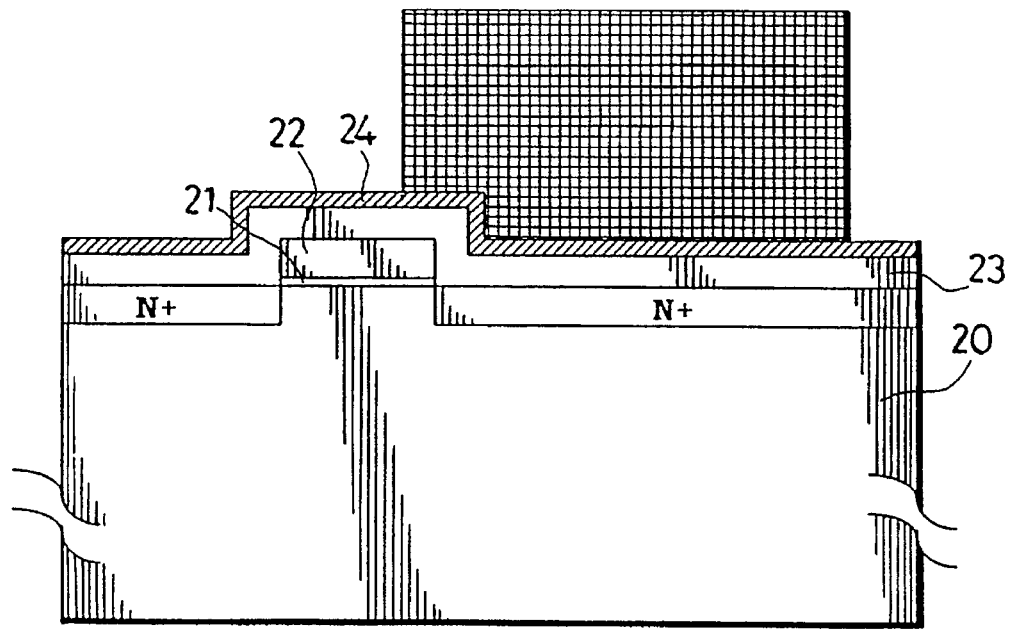
Figure 8:
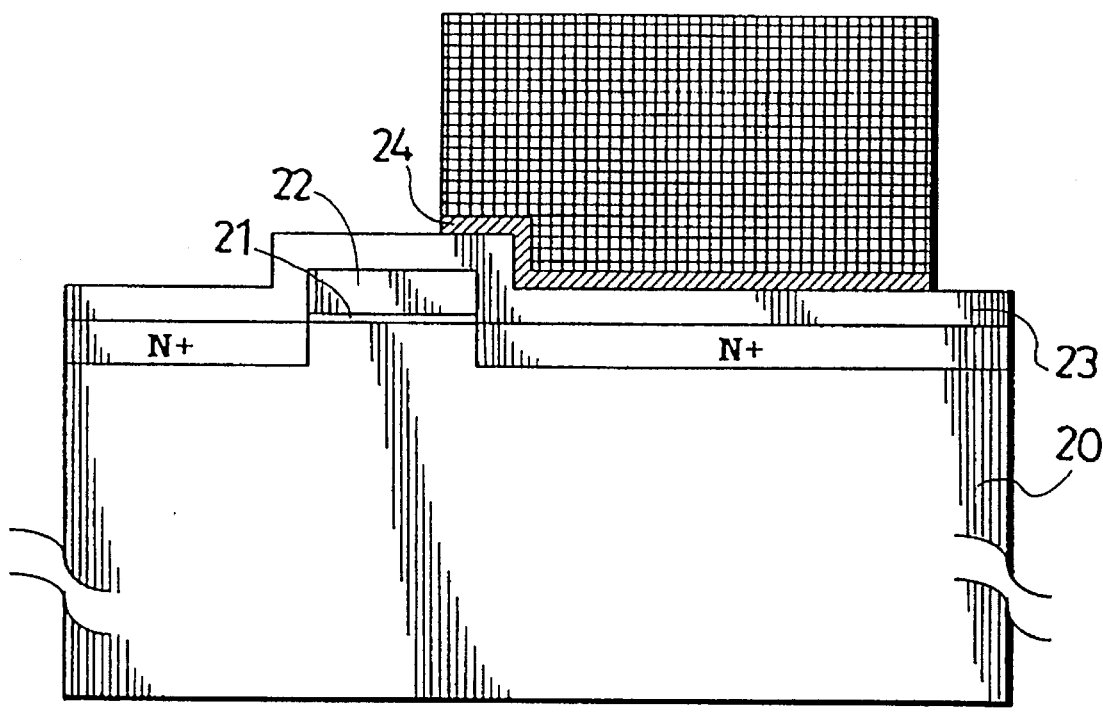
Figure 9:
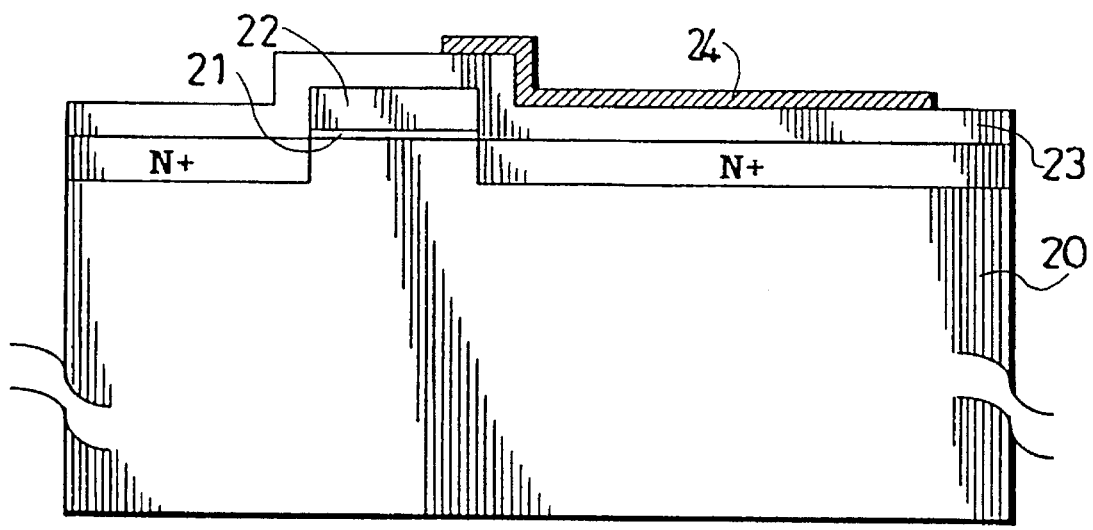

Referring now to FIGS. 7, 8 and 9, a mask (M1) is provided on the polysilicon layer 24. Then, the portions of the polysilicon layer 24 which are not covered by the mask (M1) are anisotropically etched so as to form a high resistance load resistor. In the present embodiment, the etch gas may be HBr/Cl2/O2.

Figure 12:
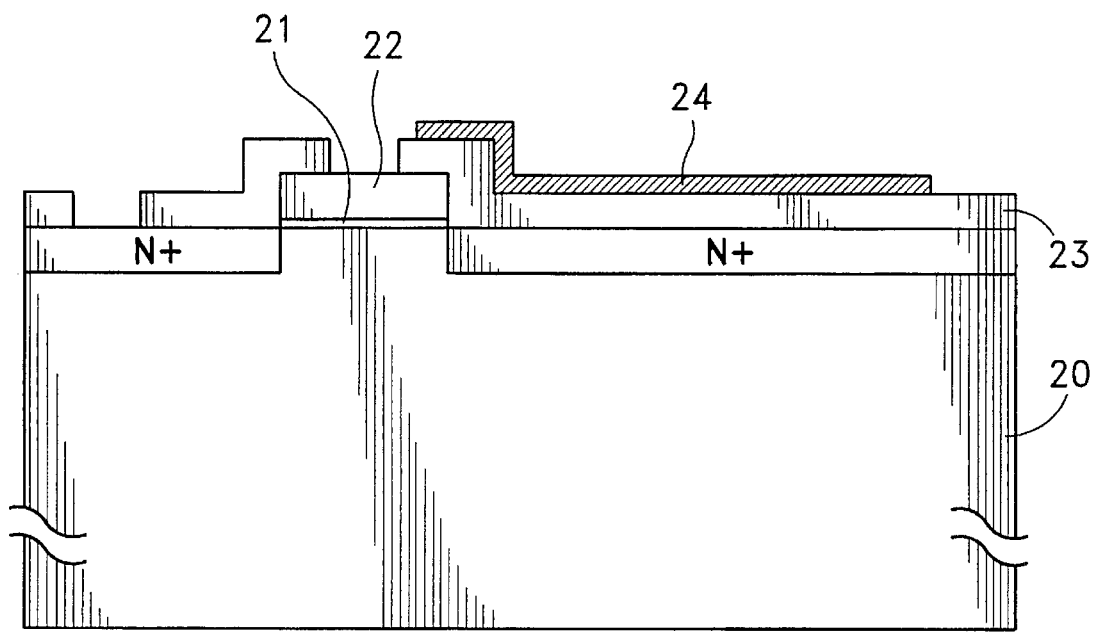

As best shown in FIGS. 10, 11 and 12, the insulating layer 23 is masked and anisotropically etched so as to expose a portion of the gate electrode layer 22. In the present embodiment, the etch gas may be CHF3/CF4.

Figure 13:
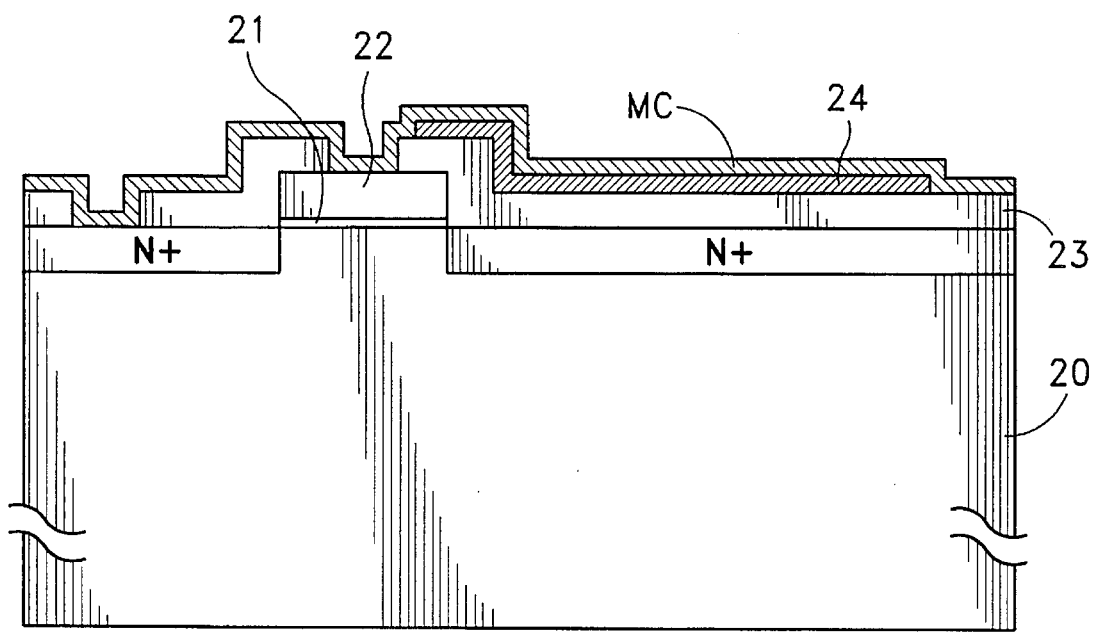
Figure 14:
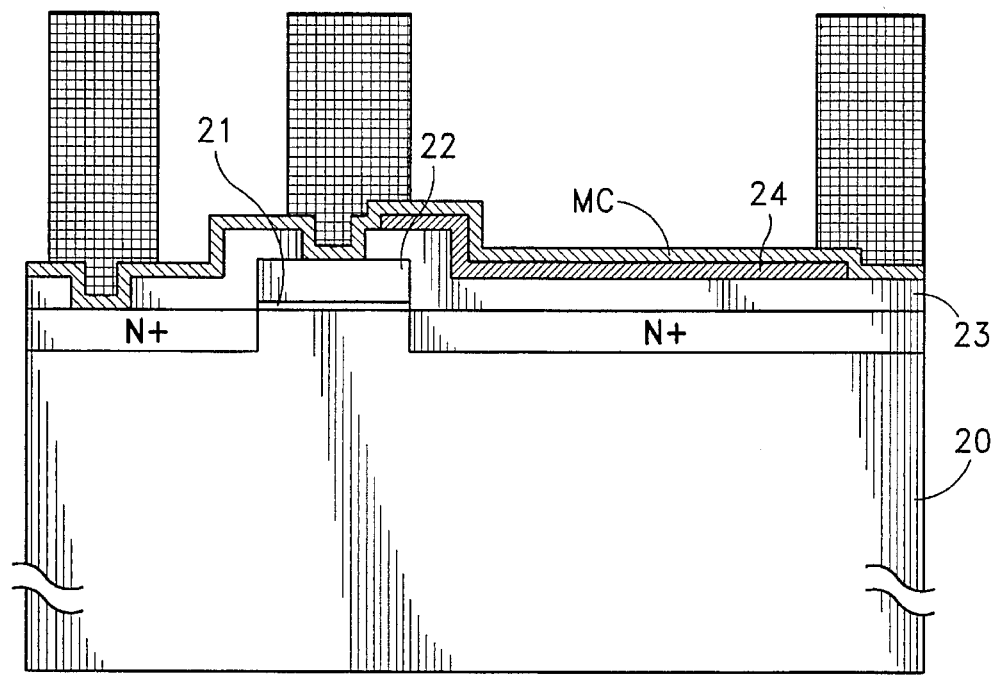
Figure 15:
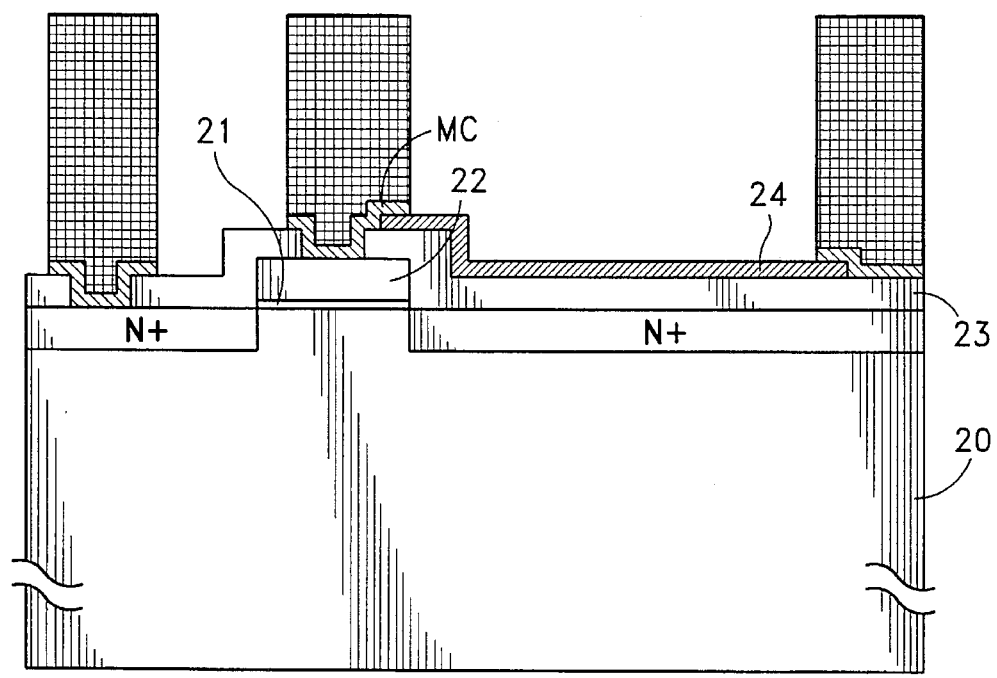

With reference to FIGS. 13, 14 and 15, a metal contact (MC) is formed at two ends of the load resistor with the use of physical vapor deposition (PVD). In the present embodiment, the metal contact (MC) may be copper or titanium or other refractory metals and ranges from 300 Å to 2500 Å in thickness. One of the metal contacts (MC) is located on the exposed portion of the gate electrode layer 22 so as to establish electrical connection between the gate electrode layer 22 and the load resistor.

Figure 16:
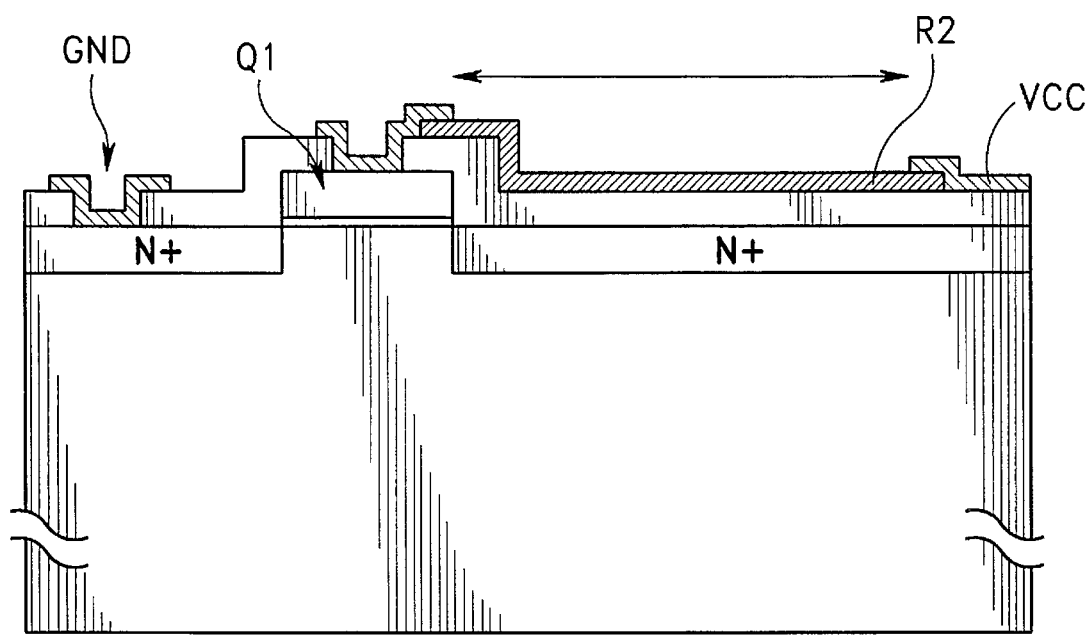
FIG. 16 is a sectional view showing a portion of the semiconductor memory cell of FIG. 3.

As best shown in FIG. 16, since no low resistance polysilicon section is present at two ends of the load resistor, no lateral diffusion will occur during the subsequent thermal process. Therefore, the high resistance of the load resistor of the semiconductor memory cell manufactured according to the method of the present invention is maintained during subsequent thermal process, thereby maintaining the low power consumption of the semiconductor memory cell.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

I claim:

1. A method for manufacturing a polysilicon load resistor of a semiconductor memory cell, the semiconductor memory cell being formed with at least one transistor and having a semiconductor substrate with a gate dielectric layer on a portion thereof, and a gate electrode layer over the gate dielectric layer, said method comprising the steps of:

(a) depositing an insulating layer over the gate electrode layer and remaining portion of the semiconductor substrate around the gate electrode and gate dielectric layers;

(b) depositing a polysilicon layer over said insulating layer;

(c) implanting ions in said polysilicon layer so as to adjust resistance thereof;

(d) etching said polysilicon layer so as to form a load resistor with two ends;

(e) etching said insulating layer so as to expose a portion of the gate electrode layer; and (f) forming a metal contact at two ends of the load resistor, one of said metal contacts being located on the exposed portion of the gate electrode so as to establish electrical connection between the gate electrode layer and said load resistor.

2. A method as claimed in claim 1, wherein the semiconductor memory cell is a static random access memory cell.

3. A method for manufacturing a semiconductor memory cell with a polysilicon load resistor and a transistor having a gate electrode connected electrically to said load resistor, said method comprising the steps of:

(a) forming a transistor on a semiconductor substrate, said transistor having a gate dielectric layer on a portion of said substrate and a gate electrode layer on said gate dielectric layer;

(b) depositing an insulating layer over said gate electrode layer and remaining portion of said semiconductor substrate around said gate dielectric and gate electrode layers;

(c) depositing a polysilicon layer over said insulating layer;

(d) implanting ions in said polysilicon layer so as to adjust resistance thereof;

(e) etching said polysilicon layer so as to form a load resistor with two ends;

(f) etching said insulating layer so as to expose a portion of said gate electrode layer; and (g) forming a metal contact at two ends of the load resistor, one of said metal contacts being located on said exposed portion of said gate electrode layer so as to establish electrical connection between said gate electrode layer and said load resistor.

4. A method as claimed in claim 3, wherein the semiconductor memory cell is a static random access memory cell.

* * * * *